United States Patent
Ng et al.

(10) Patent No.: US 7,655,977 B2
(45) Date of Patent: Feb. 2, 2010

(54) TRENCH IGBT FOR HIGHLY CAPACITIVE LOADS

(75) Inventors: Chiu Ng, El Segundo, CA (US); Davide Chiola, Marina Del Rey, CA (US)

(73) Assignee: International Rectifier Corporation, El Segundo, CA (US)

( * ) Notice: Subject to any disclaimer, the term of this patent is extended or adjusted under 35 U.S.C. 154(b) by 408 days.

(21) Appl. No.: 11/252,642

(22) Filed: Oct. 18, 2005

(65) Prior Publication Data

US 2007/0085148 A1  Apr. 19, 2007

(51) Int. Cl.
*H01L 23/62* (2006.01)
(52) U.S. Cl. .............. 257/335; 257/328; 257/578; 257/591; 257/E29.027
(58) Field of Classification Search .............. 257/335
See application file for complete search history.

(56) References Cited

U.S. PATENT DOCUMENTS

| | | | |
|---|---|---|---|
| 5,262,336 A * | 11/1993 | Pike et al. ............... 438/138 |
| 5,766,966 A * | 6/1998 | Ng ............................ 438/138 |
| 6,608,351 B1 * | 8/2003 | Meeuwsen et al. ......... 257/343 |
| 6,953,968 B2 * | 10/2005 | Nakamura et al. ......... 257/328 |
| 2002/0100935 A1 * | 8/2002 | Inoue ....................... 257/341 |

* cited by examiner

*Primary Examiner*—Kenneth A Parker
*Assistant Examiner*—Jose R Diaz
(74) *Attorney, Agent, or Firm*—Farjami & Farjami LLP

(57) ABSTRACT

An IGBT for controlling the application of power to a plasma display panel has an increased current conduction capability and a reduced conduction loss at the expense of a reduced safe operating area. For a device with a 300 volt breakdown voltage rating, the die has a substrate resistivity less than 10 m ohm cm; a buffer layer thickness of about 8 μm resistivity in the range of 0.05 to 0.10 ohm cm, and an epi layer for receiving junction patterns and trenches, which has a thickness of from 31 to 37 μm and resistivity in te range of 14 to 18 ohm cm.

14 Claims, 2 Drawing Sheets

TRENCH IGBT FOR HIGHLY CAPACITIVE LOADS

FIELD OF THE INVENTION

This invention relates to Insulated Gate Bipolar Transistors ("IGBT"s) and more specifically relates to an IGBT structure for highly capacitive loads and Plasma Display Panels in particular.

BACKGROUND OF THE INVENTION

IGBTs are well known, and are shown, for example, in U.S. Pat. Nos. 6,683,331 and 6,707,111 both of which are assigned to the assignee of the present invention. Trench IGBTs are also described in copending application Ser. No. 11/230,969, filed Sep. 20, 2005 (entitled TRENCH IGBT WITH INCREASED SHORT CIRCUIT CAPABILITY in our names (IR-2949) the contents of which are incorporated herein by reference.

IGBTs are replacing power MOSFETs in highly capacitive load applications. Thus, plasma display panels used, for example, in projection TV receivers, act as highly capacitive loads in two basic circuits of sustain and energy recover. The IGBT is useful for such loads because of its higher current conduction capability and reduced conduction loss compared to the power MOSFET.

It would be desirable to further increase the current conduction ability and further reduce the conduction loss of an IGBT to enable the use of smaller chip area IGBTs for such capacitive loads.

BRIEF DESCRIPTION OF THE INVENTION

When the output circuit controlled by an IGBT is capacitive, the IGBT is turned on and off with little voltage applied (soft switching). It has been recognized by us that the safe operating area ("SOA") of the IGBT operating into a capacitive load can therefore be traded in favor of faster turn-on and lower conduction-loss characteristics.

In accordance with the invention, a trench IGBT is arranged to provide improved operation for a highly capacitive load, in particular, a plasma display panel, in which device SOA is intentionally reduced in favor of faster turn-on times and lower conduction losses. This is accomplished, for a 300 volt illustrative device, through the control and reduction of substrate resistivity, buffer layer resistivity and thickness, and a reduction in the junction receiving epitaxial layer resistivity and thickness.

Preferably, the following design is employed for the 300 volt trench IGBT:

Substrate resistivity: <10 mohm.
Buffer resistivity: 0.05 to 0.1 ohm cm.
Buffer layer thickness: 8 μm.
Epi layer resistivity: 14 to 18 ohm cm.
Epi layer thickness: 31 to 37 μm.

DETAILED DESCRIPTION OF THE INVENTION

Figure 1:
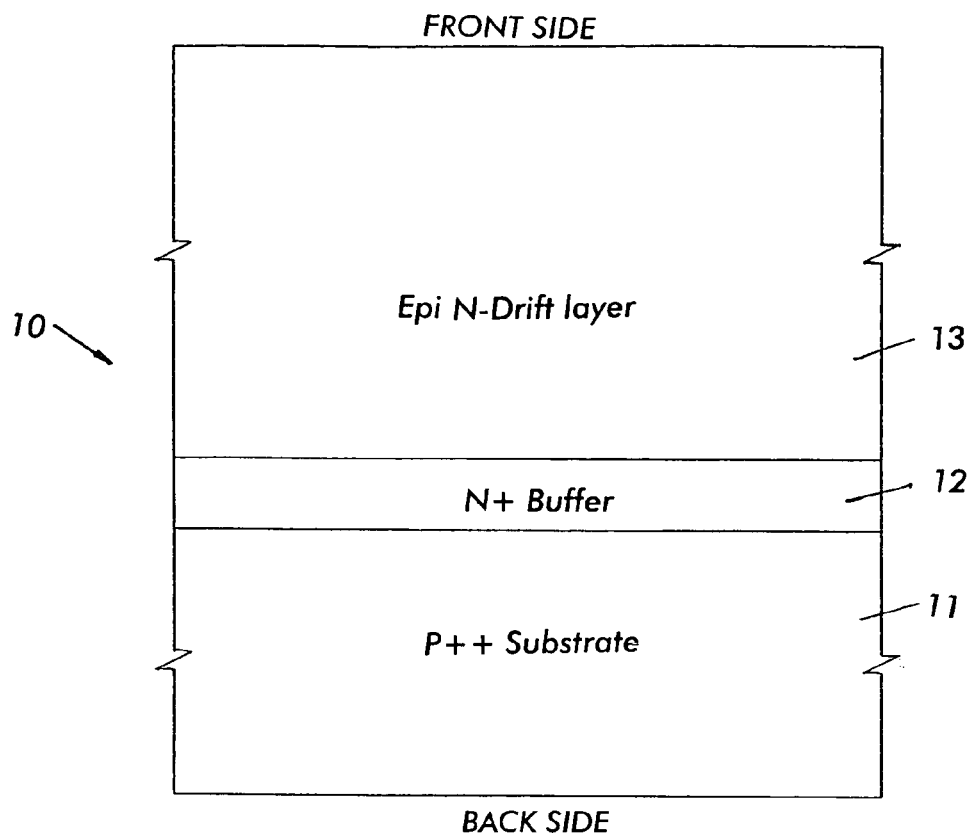
FIG. 1 is a cross-section of a small portion of a starting wafer of the invention.
Figure 2:
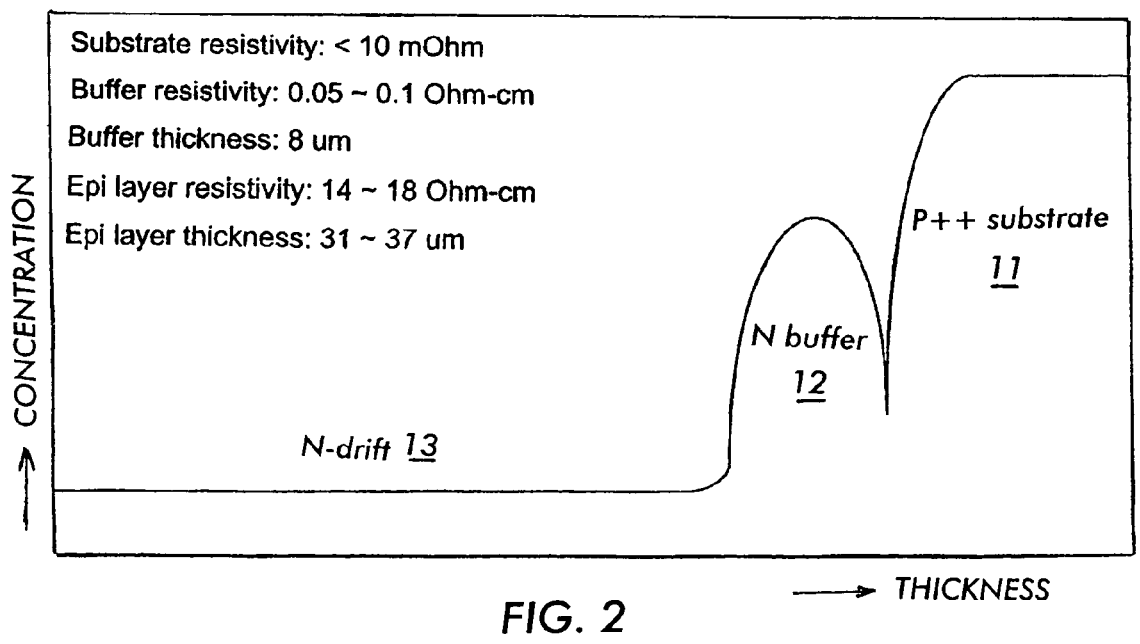
FIG. 2 is a diagram of the concentration of the various layers of the IGBT wafer of the invention (or IGBT die which is singulated from the wafer), targeted to a 300 volt device.

FIGS. 1 and 2 show the starting wafer (or die) of the invention which is configured to produce a maximized turn-off speed, and a minimized conduction loss at the expense of SOA.

Thus, in FIGS. 1 and 2, the wafer 10 has a $P^{++}$ substrate 11. An epitaxially grown drift layer 13 is grown atop an $N^+$ buffer 12 diffused into substrate 11, all using well known and conventional process techniques. The device junctions and trenches are formed in the epi drift layer 13. However, the specific dimensions and resistivities are selected to impart improved turn-off speed and conduction-loss to make IGBT devices which are applicable for use with highly capacitive loads such as PDP displays with reduced silicon die area for a given application.

Thus, for a 300 volt IGBT, the following characteristics are selected:

Resistivity of substrate 11: <10 mohm cm.
Resistivity of buffer 12: 0.05-0.1 ohm cm.
Buffer 12 thickness: 8 μm.
Resistivity of drift layer 13: 14-18 ohm cm.
Thickness of drift layer: 31-37 μm.

Figure 3:
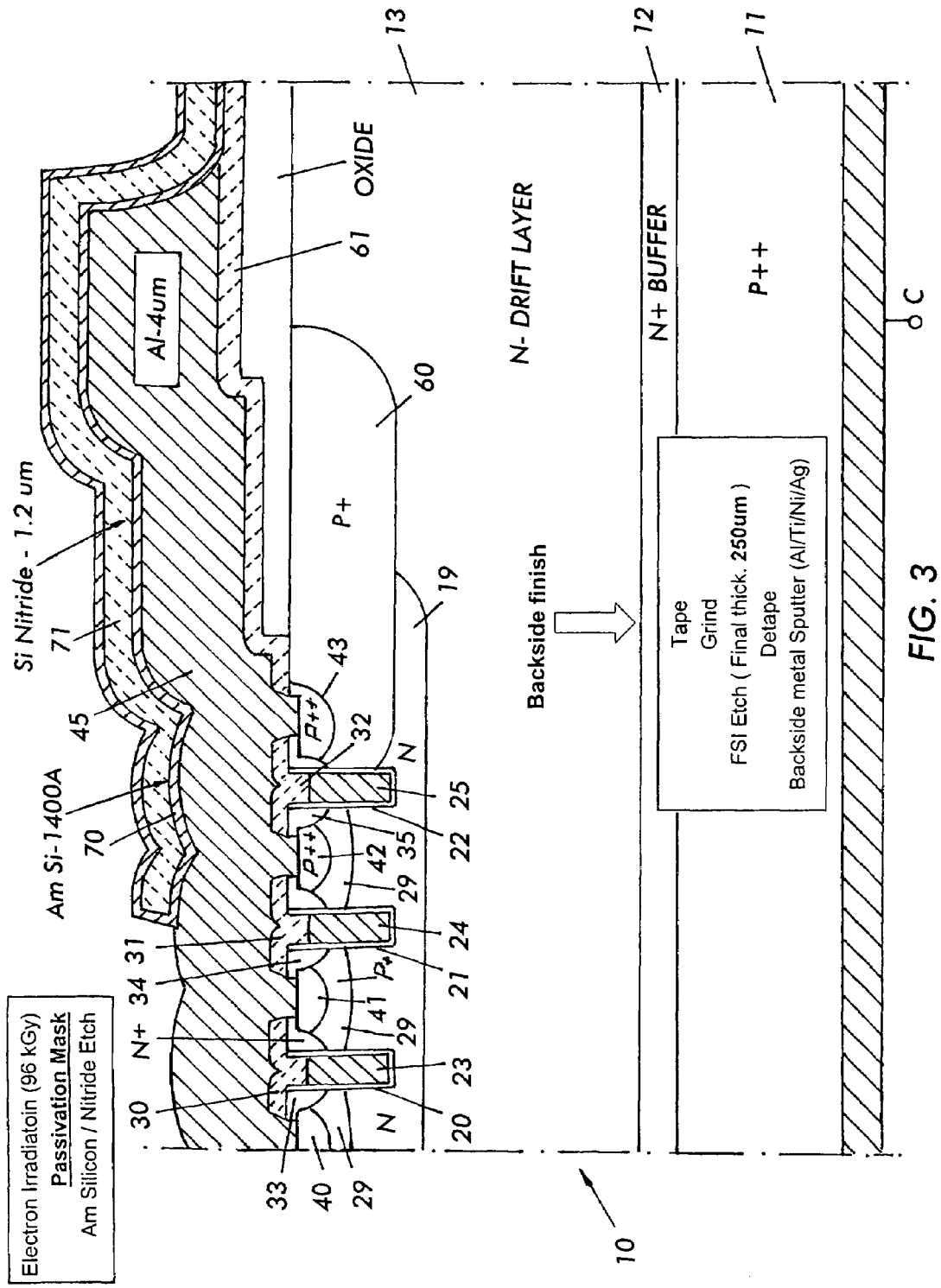
FIG. 3 is a cross-section of the finished IGBT according to the invention, showing a finished trench MOSgated structure in the top of the die or wafer.

FIG. 3 shows the finished IGBT after trenches, junctions and contacts are formed on the wafer (or die) of FIGS. 1 and 2.

Thus, using any desired process, an N type trench receiving region 19 is formed and receives a plurality of trenches 20, 21, 22 which are formed in the device active area and contain polysilicon gates 23, 24, 25 respectively which are separated from the trench walls by suitable gate oxides. The trenches 20, 21, 22 are typical of any desired number of trenches used in the device active area.

Trenches 20, 21, 22 pass through $P^{30}$ channel diffusion 29. The polysilicon masses 23, 24 and 25 are capped by capping oxides 30, 31, 32 respectively and $N^{30}$ emitter regions 33, 34 and 35 are provided in the usual manner. $P^{++}$ source contact diffusions 40, 41, 42 and 43 are also provided to make contact to the aluminum source contact 45 which contacts the emitter regions 33, 34 and 35 and the $P^+$ channel 30.

A $P^+$ termination region 60 is formed and is covered by oxide layer 61 and is connected to the source (or emitter) 45 at $P^{++}$ region 43. The source 45 is then passivated by the Am Si layer 70 and silicon nitride layer 71. These are etched to expose a contact area to the electrode 45.

After the top surface is completed in FIG. 3, the backside of the wafer is conventionally furnished as shown and collector contact 80 (Al/Ti/Ni/Ag) is applied to the wafer bottom surface.

Note that any desired junction pattern and topology can be employed to finish the die without departing from the invention.

Although the present invention has been described in relation to particular embodiments thereof, many other variations and modifications and other uses will become apparent to those skilled in the art. It is preferred, therefore, that the present invention be limited not by the specific disclosure herein.

What is claimed is:

1. An IGBT comprising a silicon die having a top surface and a bottom surface; said die having a $P^{++}$ substrate layer extending from said bottom surface, an $N^+$ buffer layer extending from the top of said substrate layer and an $N^-$ drift layer extending from the top of said buffer layer to said top surface; said top surface receiving a MOSgated structure and a top power electrode; a plurality of $P^{++}$ regions formed in said die and spaced apart; each of said $P^{++}$ regions connected to said top electrode; a $P^+$ termination region adjacent one of said $P^{++}$ regions and connected to said top electrode through said one of said $P^{++}$ regions; and an oxide body over said $P^+$ termination region and extending under a portion of said top electrode; said bottom surface receiving a bottom power elcctrode; said $P^{++}$ substrate having a resistivity less than about 10 ohm cm; said buffer layer having a resistivity in the range of 0.05 to 0.10 ohm cm, wherein said drift layer has a thickness in the range of 31 to 37 μm and a resistivity in the range of 14 to 18 ohm cm.

2. The IGBT of claim 1, wherein said MOSgated structure includes a plurality of trenches and a trench topology.

3. The device of claim 2, wherein said IGBT is a 300 volt IGBT with minimized turn-off time, maximized conduction current capability and an intentionally reduced SOA.

4. The device of claim 1, wherein said IGBT is a 300 volt IGBT with minimized turn-off time, maximized conduction current capability and an intentionally reduced SOA.

5. The device of claim 1, wherein said $N^-$ drift layer is epitaxially grown silicon and is targeted to a breakdown voltage of 300 volts.

6. The IGBT of claim 5, wherein said NOSgated structure includes a plurality of trenches and a trench topology.

7. The IGBT of claim 1, further comprising a silicon nitride layer over said portion of said top electrode.

8. The IGBT of claim 7, further comprising a silicon layer disposed between said silicon nitride layer and said top electrode.

9. An IGBT adapted for use with a highly capacitive plasma display panel load; said IGBT comprising a silicon die having a top surface and a bottom surface; said die having a $P^{++}$ substrate layer extending from said bottom surface, an $N^+$ buffer layer extending from the top of said substrate layer and an $N^-$ drift layer extending from the top of said buffer layer to said top surface; said top surface receiving a MOSgated structure and a top power electrode; a plurality of $P^{++}$ regions formed in said die and spaced apart; each of said $P^{++}$ regions connected to said top electrode; a $P^{++}$ termination region adjacent one of said $P^{++}$ regions and connected to said top electrode through said one of said $P^{++}$ regions; and an oxide body over said $P^+$ termination region and extending under a portion of said top electrode; said bottom surface receiving a bottom power electrode; said $P^{++}$ substrate having a resistivity less than about 10 mohm cm; said buffer layer having a thickness of about 8 μm and a resistivity in the range of 0.05 to 0.10 ohm cm, wherein said drift layer has a thickness in the range of 31 to 37 μ and a resistivity in the range of 14 to 18 ohm cm.

10. The IGBT of claim 9, wherein said MOSgated structure includes a plurality of trenches and a trench topology.

11. The device of claim 9, wherein said IGBT is a 300 volt IGBT with minimized turnoff time, maximized conduction current capability and an intentionally reduced SOA.

12. The IGBT of claim 11, wherein said MOSgated structure includes a plurality of trenches and a trench topology.

13. The ICBT of claim 9, further comprising a silicon nitride layer over said portion of said top electrode.

14. The IGBT of claim 13, further comprising a silicon layer disposed between said silicon nitride layer and said top electrode.

* * * * *

UNITED STATES PATENT AND TRADEMARK OFFICE
CERTIFICATE OF CORRECTION

| | | |
|---|---|---|
| PATENT NO. | : 7,655,977 B2 | Page 1 of 1 |
| APPLICATION NO. | : 11/252642 | |
| DATED | : February 2, 2010 | |
| INVENTOR(S) | : Ng et al. | |

It is certified that error appears in the above-identified patent and that said Letters Patent is hereby corrected as shown below:

In the claims, column 3, line 11, "10 ohm cm" should be changed to --10 mohm cm--.

In the claims, column 3, line 27, "NOSgated" should be changed to --MOSgated--.

In the claims, column 4, line 10, "$P^{++}$ termination region" should be changed to --$P^+$ termination region--.

In the claims, column 4, line 19, "37 μ" should be changed to --37 μm--.

In the claims, column 4, line 24, "turnoff" should be changed to --turn-off--.

In the claims, column 4, line 28, "ICBT" should be changed to --IGBT--.

Signed and Sealed this
First Day of November, 2011

David J. Kappos
*Director of the United States Patent and Trademark Office*